United States Patent
Ouyang et al.

(10) Patent No.: US 10,114,589 B2
(45) Date of Patent: Oct. 30, 2018

(54) COMMAND CONTROL FOR MULTI-CORE NON-VOLATILE MEMORY

(71) Applicant: SanDisk Technologies LLC, Plano, TX (US)

(72) Inventors: Jingwen Ouyang, Mountain View, CA (US); Greg Hilton, Milpitas, CA (US); Jayesh Pakhale, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/408,318

(22) Filed: Jan. 17, 2017

(65) Prior Publication Data
US 2018/0136877 A1     May 17, 2018

Related U.S. Application Data

(60) Provisional application No. 62/423,132, filed on Nov. 16, 2016.

(51) Int. Cl.
| | |
|---|---|
| *G06F 3/06* | (2006.01) |
| *G11C 16/32* | (2006.01) |
| *G11C 16/26* | (2006.01) |
| *G11C 16/10* | (2006.01) |
| *G11C 16/08* | (2006.01) |
| *G11C 16/04* | (2006.01) |

(52) U.S. Cl.
CPC .......... *G06F 3/0659* (2013.01); *G06F 3/0613* (2013.01); *G06F 3/0679* (2013.01); *G11C 16/08* (2013.01); *G11C 16/10* (2013.01); *G11C 16/26* (2013.01); *G11C 16/32* (2013.01); *G11C 16/0483* (2013.01)

(58) Field of Classification Search
CPC .... G06F 3/0659; G06F 3/0613; G06F 3/0679; G11C 16/08; G11C 16/10; G11C 16/26; G11C 16/32; G11C 16/0483
See application file for complete search history.

(56) References Cited

U.S. PATENT DOCUMENTS

| | | | |
|---|---|---|---|
| 5,022,004 A | 6/1991 | Kurtze et al. | |
| 5,548,795 A * | 8/1996 | Au | ........................ G06F 3/0601 710/3 |
| 5,664,114 A | 9/1997 | Krech, Jr. et al. | |
| (Continued) | | | |

OTHER PUBLICATIONS

Jedec Standard, Low Power Double Data Rate 3 (LPDDR3), JESD209-3, May 2012, Arlington, VA.

*Primary Examiner* — Arpan P. Savla
*Assistant Examiner* — Andrew J Cheong
(74) *Attorney, Agent, or Firm* — Kunzler, PC

(57) ABSTRACT

Apparatuses, systems, and methods are disclosed for controlling commands for non-volatile memory. An apparatus includes one or more memory die. A memory die includes a command/address buffer, an on-die controller, and a plurality of non-volatile memory cores that share a data path. A core includes an array of non-volatile memory cells. A command/address buffer queues command and address information for a plurality of storage operations for one or more non-volatile memory cores. An on-die controller initiates a first unexecuted read operation and a first unexecuted write operation from a command/address buffer in parallel, in response to determining that core dependencies are satisfied for a read operation and a write operation.

18 Claims, 7 Drawing Sheets

(56) References Cited

U.S. PATENT DOCUMENTS

| | | |
|---|---|---|
| 5,951,635 A | 9/1999 | Kamgar |
| 6,091,663 A | 7/2000 | Kim et al. |
| 6,166,564 A | 12/2000 | Rosen |
| 6,216,178 B1 * | 4/2001 | Stracovsky ......... G06F 12/0215 710/116 |
| 6,263,410 B1 | 7/2001 | Kao et al. |
| 6,385,129 B1 | 5/2002 | Silvestri |
| 6,393,512 B1 * | 5/2002 | Chen ................ G06F 13/1647 711/5 |
| 6,393,534 B1 * | 5/2002 | Chen ................ G06F 13/1631 711/158 |
| 6,504,768 B1 * | 1/2003 | Roohparvar ......... G11C 29/846 365/189.05 |
| 6,567,321 B2 | 5/2003 | Lee |
| 6,614,798 B1 | 9/2003 | Bishop et al. |
| 6,628,563 B1 * | 9/2003 | Hsu ................ G11C 16/08 365/185.11 |
| 6,778,445 B2 * | 8/2004 | Ooishi ................ G11C 7/1039 365/158 |
| 6,912,598 B1 * | 6/2005 | Bedarida ................ G11C 16/10 365/189.04 |
| 7,038,952 B1 | 5/2006 | Zack et al. |
| 7,038,953 B2 | 5/2006 | Aoki |
| 7,184,508 B2 | 2/2007 | Emberling |
| 7,254,688 B2 | 8/2007 | Uneme |
| 7,277,982 B2 | 10/2007 | Calvignac et al. |
| 7,310,396 B1 | 12/2007 | Sabih |
| 7,499,364 B2 | 3/2009 | Ahn et al. |
| 7,889,580 B2 | 2/2011 | Millar et al. |
| 7,970,977 B1 * | 6/2011 | Li ................ G06F 13/4036 710/306 |
| 8,327,057 B1 * | 12/2012 | Venkatramani ..... G06F 12/0607 711/158 |
| 13,612,651 | 12/2013 | Boonstra et al. |
| 8,656,093 B1 | 2/2014 | Edmondson et al. |
| 8,832,324 B1 | 9/2014 | Hodges et al. |
| 8,914,589 B2 | 12/2014 | Gregorius et al. |
| 9,087,568 B1 | 7/2015 | Ware |
| 9,285,824 B2 | 3/2016 | Zhu et al. |
| 9,851,905 B1 * | 12/2017 | Ramalingam ......... G06F 3/0611 |
| 9,858,976 B2 * | 1/2018 | Ikegami ............. G11C 11/1675 |
| 2001/0036105 A1 * | 11/2001 | Takata ................ G11C 16/10 365/185.11 |
| 2002/0159294 A1 * | 10/2002 | Kato ................ G11C 16/3468 365/185.22 |
| 2003/0120861 A1 * | 6/2003 | Calle ................ G06F 13/1647 711/105 |
| 2004/0027856 A1 * | 2/2004 | Lee ................ G11C 16/0408 365/185.11 |
| 2004/0027857 A1 * | 2/2004 | Ooishi ................ G11C 16/10 365/185.11 |
| 2004/0057282 A1 * | 3/2004 | Cernea ................ G11C 7/1036 365/185.01 |
| 2004/0057283 A1 * | 3/2004 | Cernea ................ G11C 7/1006 365/185.11 |
| 2004/0060031 A1 * | 3/2004 | Cernea ................ G11C 7/06 365/185.23 |
| 2004/0156235 A1 * | 8/2004 | Bellini ................ G11C 16/26 365/185.13 |
| 2005/0071547 A1 * | 3/2005 | Lin ................ G06F 3/061 711/112 |
| 2005/0114556 A1 * | 5/2005 | Solomon ................ G06F 13/423 710/5 |
| 2006/0140007 A1 * | 6/2006 | Cernea ................ G11C 16/26 365/185.21 |
| 2008/0094871 A1 * | 4/2008 | Parkinson ............ G11C 7/1006 365/100 |
| 2008/0109627 A1 * | 5/2008 | Toyama ............... G06F 13/1647 711/167 |
| 2008/0151648 A1 * | 6/2008 | Eilert ................ G06F 13/4239 365/189.02 |
| 2008/0225625 A1 * | 9/2008 | Parkinson ............ G11C 7/065 365/230.06 |
| 2010/0100668 A1 * | 4/2010 | Huang ................ G06F 12/0246 711/103 |
| 2010/0100669 A1 * | 4/2010 | Huang ................ G06F 12/0246 711/103 |
| 2010/0103723 A1 * | 4/2010 | Kawai ................ G11C 11/56 365/163 |
| 2010/0185703 A1 * | 7/2010 | Ylonen ............... G06F 12/0269 707/816 |
| 2011/0051518 A1 * | 3/2011 | Fujimura ............... G11C 16/04 365/185.17 |
| 2011/0051519 A1 * | 3/2011 | Lee ................ G11C 7/1075 365/185.18 |
| 2011/0069526 A1 * | 3/2011 | Schuette ................ G06F 3/0611 365/63 |
| 2011/0072200 A1 * | 3/2011 | Lee ................ G11C 7/1006 711/103 |
| 2011/0072201 A1 * | 3/2011 | Lee ................ G11C 16/0408 711/103 |
| 2011/0208905 A1 * | 8/2011 | Shaeffer ................ G11C 16/10 711/103 |
| 2012/0210041 A1 | 8/2012 | Flynn et al. |
| 2012/0213012 A1 | 8/2012 | Johnson et al. |
| 2012/0250411 A1 * | 10/2012 | Abiko ................ G11C 16/26 365/185.09 |
| 2012/0260032 A1 * | 10/2012 | Chiu ................ G06F 13/1626 711/105 |
| 2013/0188482 A1 * | 7/2013 | Lee ................ H04L 43/0852 370/235 |
| 2014/0019672 A1 * | 1/2014 | Harasawa ........... G06F 12/0246 711/103 |
| 2014/0075233 A1 * | 3/2014 | Bartling ................ H03K 3/3562 713/324 |
| 2014/0250260 A1 | 9/2014 | Yap |
| 2017/0199668 A1 | 7/2017 | Ouyang et al. |
| 2017/0262192 A1 * | 9/2017 | Aga ................ G06F 3/0611 |

\* cited by examiner

COMMAND CONTROL FOR MULTI-CORE NON-VOLATILE MEMORY

CROSS-REFERENCES TO RELATED APPLICATIONS

This patent application claims the benefit of U.S. Provisional Patent Application No. 62/423,132 entitled "COMMAND CONTROL FOR MULTI-CORE NON-VOLATILE MEMORY" and filed on Nov. 16, 2016 for Jingwen Ouyang et al., the entire contents of which are incorporated herein by reference for all purposes.

TECHNICAL FIELD

The present disclosure, in various embodiments, relates to non-volatile memory and more particularly relates to controlling commands and data for multi-core non-volatile memory.

BACKGROUND

A single-core non-volatile memory element may execute storage operations (e.g., read, write, program, and/or erase operations) sequentially. By contrast, a multiple-core non-volatile memory element may execute storage operations in parallel. However, executing storage operations in parallel may result in data collisions on a shared data path or data bus, data being transferred out of order, or even the wrong data being transferred if a read and a write for the same location are processed out of order.

SUMMARY

Apparatuses are presented for controlling commands for non-volatile memory. In one embodiment, an apparatus includes one or more memory die. In a certain embodiment, a memory die includes a plurality of non-volatile memory cores that share a data path. In a further embodiment a core includes an array of non-volatile memory cells. In one embodiment, a memory die includes a command/address buffer that queues command and address information for a plurality of storage operations for one or more non-volatile memory cores. In a certain embodiment, a memory die includes an on-die controller that initiates a first unexecuted read operation and a first unexecuted write operation from a command/address buffer in parallel, in response to determining that core dependencies are satisfied for the read operation and the write operation.

Systems are presented for controlling commands for non-volatile memory. In one embodiment, a system includes one or more memory die. In a certain embodiment, a memory die includes a plurality of non-volatile memory cores. In a further embodiment a core includes an array of non-volatile memory cells. In one embodiment, a memory die includes a command/address queue that stores command and address information for a plurality of storage operations for one or more non-volatile memory cores. In a certain embodiment, a memory die includes an on-die controller that dispatches addresses for executing a first valid read operation and a first valid write operation from a command/address queue in parallel, in response to determining that the command/address queue has no previously-scheduled valid write operations for a core for the read operation, and has no previously-scheduled valid read operations for a core for the write operation. In one embodiment, a system includes a device controller that communicates with an on-die controller for a selected die to send command and address information and to transfer data for storage operations on the selected die.

An apparatus, in another embodiment, includes means for queuing command and address information for a plurality of storage operations for non-volatile memory cores that share a data path for a non-volatile memory die. In a certain embodiment, an apparatus includes means for identifying a first valid read operation and a first valid write operation, based on a queued command and address information. In a further embodiment, an apparatus includes means for determining whether core dependencies are satisfied for a read operation and a write operation. In some embodiments, determining whether a core dependency is satisfied for an operation may include determining whether another valid operation of a different type is scheduled prior to the operation, for the same core as the operation. In one embodiment, an apparatus includes means for initiating a read operation and a write operation in parallel based on determining that one or more core dependencies are satisfied.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
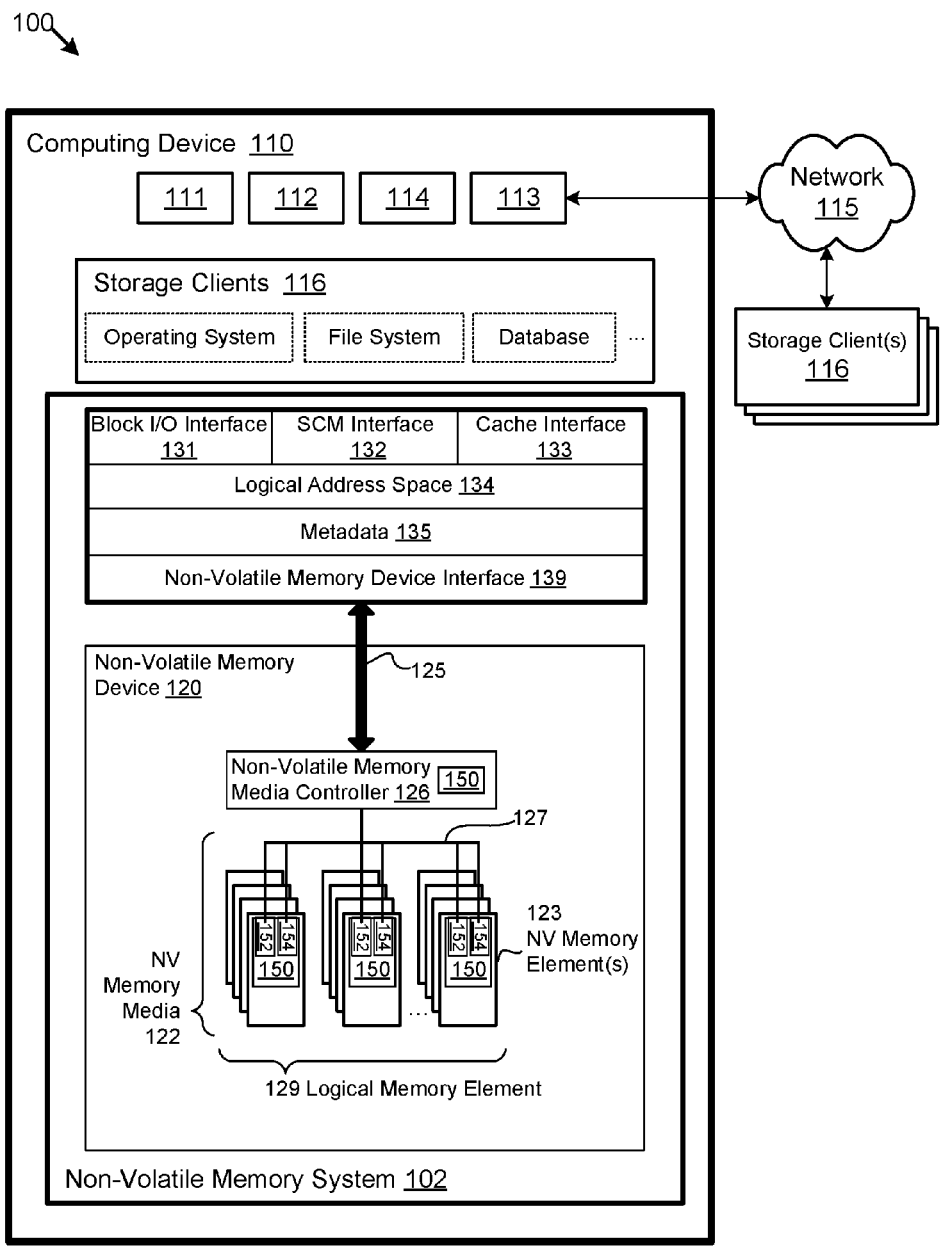
FIG. 1 is a schematic block diagram illustrating one embodiment of a system comprising a command control component.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, resistive (e.g., resistive random access memory (ReRAM), memory resistor (Memristor) memory, programmable metallization cell memory, phase-change memory (PCM, PCME, PRAM, PCRAM, ovonic unified memory, chalcogenide RAM, or C-RAM), or the like), or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising a command control component 150 for a non-volatile memory device 120. The command control component 150 may be part of and/or in communication with a non-volatile memory media controller 126, a non-volatile memory element 123, a device driver, or the like. The command control component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, one or more portions of the command control component 150 may be embodied as one or more computer readable instructions stored on the non-transitory storage medium 114.

In one embodiment, the one or more non-volatile memory elements 123 may be configured to transmit and receive data for data operations for the non-volatile memory device 120. For example, a non-volatile memory element 123 may comprise a first port, bus or path 152 for communicating command and address information for storage operations, and a second port, bus, or path 154 for transferring data for storage operations. A non-volatile memory element 123 may support multiple access modes, such as a first mode (e.g., a burst mode) which may provide a full speed and/or access to one or more unique features of the non-volatile memory media 122, a second mode (e.g., a legacy mode or compatibility mode) which may provide support for a different access protocol (e.g., an older access protocol, emulating a different type of memory media 122 such as NAND flash, or the like. For example, in one embodiment, the non-volatile memory media 122 may comprise a resistive memory medium such as ReRAM, Memristor memory, programmable metallization cell memory, phase-change memory (PCM, PCME, PRAM, PCRAM, ovonic unified memory, chalcogenide RAM, or C-RAM), or the like and a non-volatile memory element 123 may provide two access modes, one mode comprising a legacy or compatibility mode which emulates a NAND flash access protocol (e.g., a NAND flash toggle mode), or the like, for clients 116 configured to use a legacy access protocol.

In a first mode (e.g., a burst mode, a native mode, or the like) the first port 152 may receive command and/or address information for data operations on the non-volatile memory device 120 and/or element 123, while the second port 154 transmits data of the data operations (e.g., receiving data from a client 116 for a write request, sending data to a client 116 for a read request, or the like). In a second mode (e.g., a legacy mode, a compatibility mode, or the like) the first port 152 may both receive command and address information for data operations and transmit data for the operations (e.g., so that the second port 154 isn't used in the second mode).

The non-volatile memory system 102, in the depicted embodiment, includes a command control component 150. The command control component 150, in one embodiment, is configured to queue command and address information for a plurality of storage operations for non-volatile memory cores that share a data path for a non-volatile memory element 123 or a memory die. In a further embodiment, the command control component 150 is configured to initiate a first unexecuted read operation and a first unexecuted write operation from the command/address buffer in parallel, in response to determining that core dependencies are satisfied for the read operation and the write operation. In general, in various embodiments, a core dependency for a read operation is satisfied if no write operation is scheduled prior to the read operation, for the same core. Similarly, in certain embodiments, a core dependency for a write operation is satisfied if no read operation is scheduled prior to the write operation, for the same core. In certain embodiments, tracking whether a read depends on a prior write (or a write depends on a prior read) at a per-core level may allow a multiple-core non-volatile memory element 123 to process storage operations in parallel using different cores, while avoiding delays that might be associated with tracking dependencies of reads and writes at a per-address level.

In one embodiment, the command control component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the command control component 150 may comprise executable software code, such as a device driver or the like, stored on the computer readable storage medium 114 for execution on the processor 111. In a further embodiment, the command control component 150 may include a combination of both executable software code and logic hardware.

In one embodiment, a non-volatile memory element 123 is configured to receive storage requests from a device driver or other executable application via a bus 125 or the like. A non-volatile memory element 123 may be further configured to transfer data to/from a device driver and/or storage clients 116 via the bus 125. Accordingly, a non-volatile memory element 123, in some embodiments, may comprise and/or be in communication with one or more direct memory access (DMA) modules, remote DMA modules, bus controllers, bridges, buffers, and so on to facilitate the transfer of storage requests and associated data. In another embodiment, a non-volatile memory element 123 may receive storage requests as an API call from a storage client 116, as an IO-CTL command, or the like.

According to various embodiments, a non-volatile memory controller 126 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device 110 interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 2:
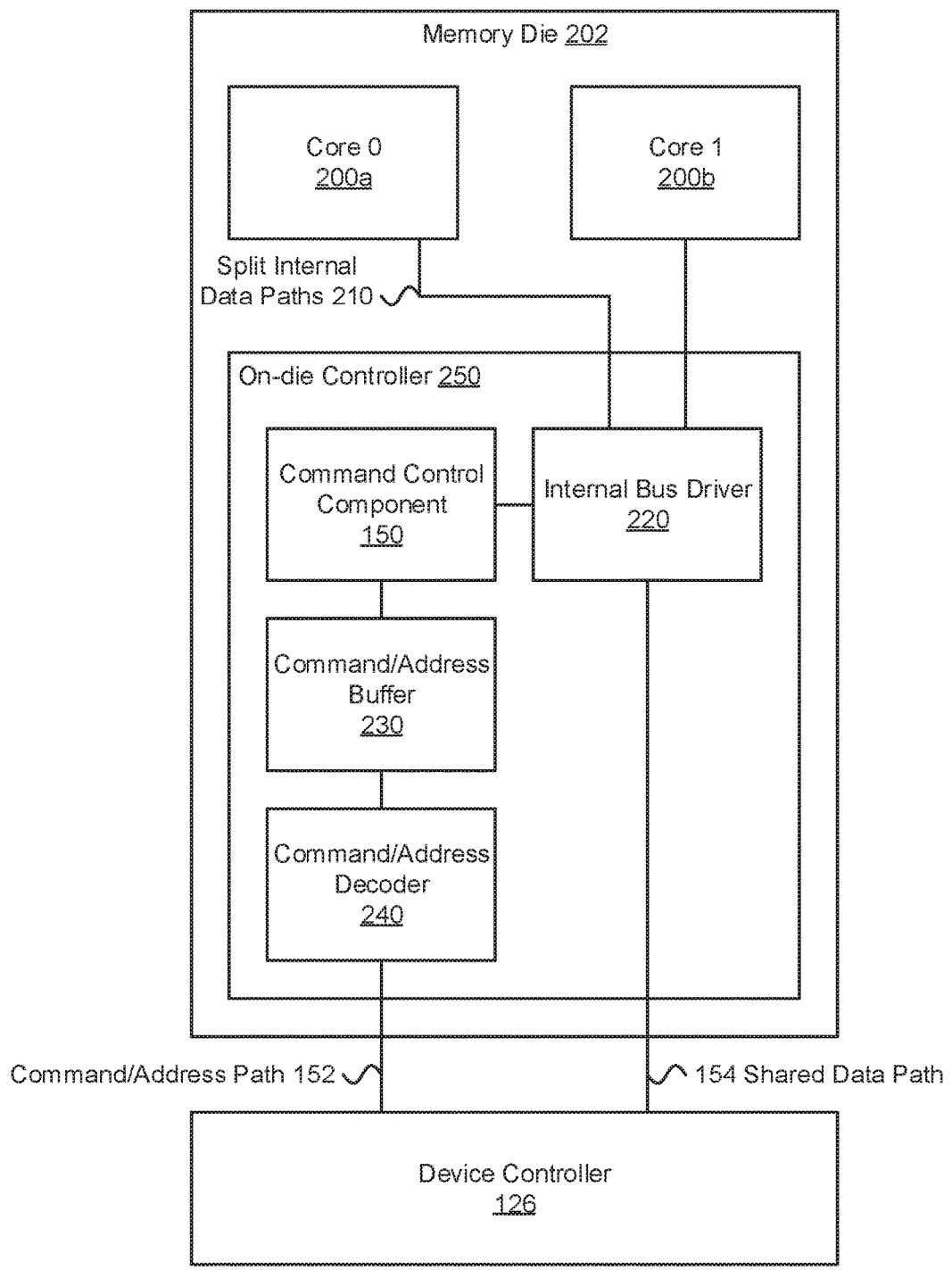
FIG. 2 is a schematic block diagram illustrating one embodiment of a multiple-core non-volatile memory element in communication with a device controller.

FIG. 2 depicts one embodiment of a multiple-core non-volatile memory die 202 in communication with a device controller 126. The device controller 126 may be substantially similar to the non-volatile memory media controller 126 described above with regard to FIG. 1. In one embodiment, the device controller 126 may include a hardware controller for a storage device including the non-volatile memory elements 123. In another embodiment, the device controller 126 may include a device driver for a storage device including the non-volatile memory elements 123, and the device driver may include logic hardware and/or executable code stored on one or more computer readable storage media. The non-volatile memory die 202 may be substantially similar to a non-volatile memory element 123 described above with regard to FIG. 1. A die 202, in various embodiments, may refer to an integrated circuit that includes at least one core 200. In one embodiment, such an integrated circuit may be a three-dimensional integrated circuit that includes multiple die planes and/or layers, but may still be referred to as a die 202. Although a single non-volatile memory die 202 is depicted in FIG. 2, a device controller 126 may be coupled to or in communication with multiple non-volatile memory die 202 in non-volatile memory elements 123 for a non-volatile memory device 120.

In the depicted embodiment, the device controller 126 is coupled to the die 202 via a first port, bus, or path 152 for command and address information, and a second port, bus, or path 154 for transferring data, which may be substantially similar to the ports, buses, or paths 152, 154 described above with regard to FIG. 1. In the depicted embodiment, the die 202 includes a plurality of cores 200, and an on-die controller 250. In the depicted embodiment, the on-die controller 250 includes a command control component 150, an internal bus driver 220, a command/address buffer 230, and a command/address decoder 240. The device controller 126 may select a die 202 (such as the depicted die 202 or another die 202) as a target for a storage operation, and may communicate with the on-die controller 250 for the selected die 202 to send command and address information and to transfer data for storage operations on the selected die 202. Data for a storage operation may include data to be written to a core 200, data to be read from a core 200, or the like, and transferring data may include sending or receiving the data.

In various embodiments, a core 200 includes an array (two or three dimensional) of non-volatile memory cells. The on-die controller 250 communicates with a core 200 to perform storage operations such as reading, writing, erasing, and the like using the array of cells for the core 200. In certain embodiments, a "cell" may refer to a smallest or fundamental physical unit of memory, or storage, for a core 200, and may be referred to interchangeably as a "storage cell" a "memory cell" or the like. For example, a cell may be a floating gate transistor for NAND flash memory, a memristor for resistive memory, or the like. Thus, in a further embodiment, an array of cells for a core 200 may be a two-dimensional grid, a three-dimensional block, a group, or other similar set of cells where data can be physically stored, for short-term memory use, long-term storage use, or the like. In certain embodiments, a core 200 may include further or peripheral components in addition to the array, such as word line drivers, sense amplifiers for bit lines, latches to store data that is being read from or written to the array, and the like.

In various embodiments, a multiple-core memory die 202 may include a plurality of non-volatile memory cores 200. For example, in the depicted embodiment, the memory die 202 includes two cores 200a-b, referred to as "core 0" 200a, and "core 1" 200b. In another embodiment, a memory die 202 may include three, four, or a larger number of cores 200. In certain embodiments, one core 200 (e.g., core 0) may process or service storage operations independently of, or in parallel with, another core 200 (e.g., core 1). For example, data may be addressable so that a data address corresponds to a byte, a page, a block, or the like, and the data addresses may correspond or be mapped to the different cores 200, so that core 0 services storage operations for a first set of addresses, and core 1 services storage operations for a second set of addresses. In certain embodiments, using a plurality of cores 200 to service storage operations independently or in parallel allows a non-volatile memory die 202 to execute, process, or service storage operations faster than a single-core memory die.

In various embodiments, a "data path" may refer to any pathway for transferring data, such as a bus, a set of wires or leads, a set of contacts, and/or the like. In the depicted embodiment, an internal data path 210 between the on-die controller 250 and the cores 200 is split, so that there is a separate or independent data path between each core 200 and the on-die controller 250. However, in a further embodiment, the external data path 154 between the on-die controller 250 and the device controller 126 is shared by the cores 200.

As used herein, an "independent" data path may refer to a data path that is used to transfer data to or from a single core 200, such as one of the split internal data paths 210. In a certain embodiment, the split internal data paths 210 may be separate channels on the same internal data bus, but may still be referred to as "independent" because each channel communicates with only one core 200. By contrast, a "shared" data path may refer to a data path that is used to transfer data to or from more than one core 200. For example, in the depicted embodiment, the cores 200 share a single data path (e.g., the shared data path 154) for communicating with the device controller 126. In certain embodiments, a shared data path may present a risk of data collisions. For example, if read operations are initiated on core 0 and core 1 at the same time, then the data from the cores 200 will collide, or arrive simultaneously at the shared data path 154. Similarly, if write operations are initiated on core 0 and core 1 at the same time, then the write data for both cores 200 cannot be sent simultaneously via the shared data path 154.

Certain types of non-volatile memory devices 120 with multiple die 202 avoid data collisions or competition for a shared data path between the die 202 by providing independent data paths between the device controller 126 and each die 202, or by using chip enable signals, clock enable signals, or the like, to control which die 202 is able to use the data path at a particular time. By contrast, cores 200 on a multiple-core die 202 may operate without independent enable or disable signals, increasing the risk of a data collision. For example, a core 200 that receives a data address for a read operation may read the data at that address and output the data as soon as it is ready, without waiting for an enable signal. Thus, in certain embodiments, an on-die controller 250 (including the command control component 150) may avoid data collisions by controlling the order and timing for dispatching commands and/or addresses to the plurality of cores 200, without directly controlling when the cores 200 send or receive data (e.g., by the use of enable or disable signals).

The on-die controller 250, in one embodiment, communicates via the command/address path 152 and the shared data path 154 to receive command and address information and to transfer data for storage operations on the cores 200. In various embodiments, an on-die controller 250 may refer to a component, control/operation logic, a set of components, or the like on a die 202, that receives command and/or address information, transfers data to or from a device controller 126, communicates commands, addresses, and/or data to the plurality of cores 200, or the like.

In the depicted embodiment, the on-die controller 250 uses the command/address decoder 240 to receive command and address information for storage operations, via the command/address path 152. In certain embodiments, command and address information may include commands, such as read commands, write commands, program commands, erase commands, status query commands, and any other commands supported by the cores 200, and addresses corresponding to the commands, such as an address to write data to, an address to read data from, or the like. The on-die controller 250 may receive command and address information from a device controller 126. For example, the device controller 126 may send command and address information using the command/address path 152.

In various embodiments, the command/address decoder 240 may decode or convert the command and address information from the device controller 126 into a format used by the command/address buffer 230 and/or the cores 200. For example, in one embodiment, the command/address decoder 240 may provide an address interface to convert between the address that is used by the host or a device controller 126 to the hardware address used by the cores 200. In a certain embodiment, the command/address decoder 240 may determine a type of command (e.g., a read command, a write command, a control command, or the like) and send an indicator of the type of command to the command/address buffer 230.

The command/address buffer 230, in the depicted embodiment, queues command and address information for a plurality of storage operations for the non-volatile memory cores 200. Storage operations may include read, write, program, or erase operations, or the like. In various embodiments, "queuing" command and address information may refer to storing the command and address information in the order in which it was sent by the device controller 126, or in a way that preserves the order. Thus, in certain embodiments, the command/address buffer 230 may be referred to as a command/address queue, a first-in-first-out (FIFO) queue, or the like. Because command and address information corresponds to storage operations, the command/address buffer 230 may be referred to interchangeably as queuing command and address information or as queuing operations, and an individual entry in the command/address buffer 230 may be referred to as a command, an operation, or the like. In certain embodiments, as described in further detail below, parallel execution of storage operations may not strictly preserve the first-in-first-out property of a traditional FIFO queue, but the command/address buffer 230 may nevertheless be referred to as a queue or FIFO because it stores the command and address information in order. In various embodiments, a command/address buffer 230 may include a set of storage locations for command and address information, such as registers, latches, a range of volatile memory, a circular buffer, or the like.

The internal bus driver 220, in the depicted embodiment, is configured to transfer data to or from the cores 200 using the split internal data paths 210, and to transfer data to or from the device controller 126 using the shared data path 154. For example, for a read operation, the internal bus driver 220 may receive the read data from a core 200, and send the read data to the device controller 126. Similarly, for a write operation, the internal bus driver 220 may receive the write data from the device controller 126 and send the write data to the relevant core 200. In various embodiments, the internal bus driver 220 may include a serializer/deserializer, a data in FIFO for queuing data for write operations, a data out FIFO for queuing data for read operations, or the like.

The command control component 150 may be substantially similar to the command control component 150 described above with regard to FIG. 1. In various embodiments, the on-die controller 250 uses the command control component 150 to control the storage and initiation of commands in the command/address buffer 230, so that command and address information is queued in order, and so that a first unexecuted read operation and a first unexecuted write operation are executed in parallel if core dependencies are satisfied.

In certain embodiments, the command control component 150 sends control information to the internal bus driver 220 to control storage operations, initiate commands or operation, dispatch addresses, or the like. For example, for a write operation, the command control component 150 may match an address received via the command/address path 152 (and stored in the command/address buffer 230) to data received via the data path 154 by the internal bus driver 220, and cause the internal bus driver 220 to send the address and the data to the core 200 that matches the address for the write operation to be executed. In another embodiment, for a read operation, the command control component 150 may send an address stored in the command/address buffer 230 to the internal bus driver 220 with a clock signal, so that the internal bus driver 220 sends the address and the clock signal to the core 200 that matches the address for the read operation. The clock signal may control the rate at which data is received from the core 200, latched into a data out FIFO, or the like.

In one embodiment, the on-die controller 250 may use the command control component 150 to initiate or dispatch a read operation and a write operation from the command/address buffer 230 in parallel. In various embodiments, initiating an operation may refer to commencing, beginning, or starting an operation in any way. For example, in one embodiment, the on-die controller 250 may initiate an operation by dispatching an address to a core 200 that will perform the operation (e.g., the on-die controller 250 may send the address via the internal bus driver 220).

In general, in various embodiments, executing operations in parallel may refer to performing two or more operations using two or more cores 200 so that the operations overlap in time to some degree. (By contrast, operations that are executed sequentially by a single core do not overlap.) However, initiating operations or dispatching addresses in parallel may more specifically refer to starting the operations at the same time, or at approximately the same time, such that a time period for sending the addresses overlaps between the two operations. As described above, initiating two read operations or two write operations in parallel may result in data collisions on the shared data path 154, in resources of the internal bus driver 220 such as data queues, or the like. Multiple operations of the same type (e.g., multiple read operations, multiple write operations, or the like) may still be executed in parallel by a multiple-core die 202 if the operations are initiated far enough apart to avoid data collisions (e.g., the addresses are dispatched sequentially). For example, a latency period for processing a read operation may be significantly longer than the time it takes to transfer the data for the read operation, and a second read operation may be initiated (e.g., for core 1) during the latency period for a first read operation (e.g., for core 0).

In addition, although initiating operations of the same type in parallel may cause data collisions, initiating operations of a different type (e.g., a read operation and a write operation) in parallel may avoid data collisions, data bus contention, or the like, because the different types of operations use the shared data path 154, or shared resources of the internal bus driver 220 at different times. Thus, in certain embodiments, the on-die controller 250 may use the command control component 150 to initiate a read operation and a write operation in parallel. In a further embodiment, the read operation and the write operation that are initiated in parallel may be a first unexecuted read operation and a first unexecuted write operation from the command/address buffer 230.

As used herein, words such as "first," "last," "prior," "subsequent," and the like, when used with regard to the command/address buffer 230 or to queued command and address information, refer to the order in which command and address information was received, which the command/address buffer 230 preserves or maintains. For example, a first unexecuted read (or write) operation in the command/address buffer 230 refers to the first such operation that has been received from the device controller 126, but that has not yet been initiated by the on-die controller 250. In one embodiment, entries for storage operations may be removed from the command/address buffer 230 when the operations are initiated or executed, and a first unexecuted read (or write) operation may be the first read (or write) operation in the command/address buffer 230. In another embodiment, entries in the command/address buffer 230 for storage operations may be marked invalid when the operations are initiated or executed, and the first unexecuted read (or write) operation may be the first valid read (or write) operation in the command/address buffer 230.

However, although dispatching a read operation and a write operation in parallel may avoid data collisions, parallel execution of read and write operations may cause problems if the write operation depends on a prior read operation for the same address, location or region (e.g., the data is not to be overwritten or erased until it has been read), or if the read operation depends on a prior write operation for the same address, location or region (e.g., the data is not to be read until the correct data has been written). The first unexecuted write operation and the first unexecuted read operation in the command/address buffer 230 will naturally include the first unexecuted operation (which will not depend on a prior operation), and a later operation (which may depend on a prior operation). For example, the first unexecuted write operation and the first unexecuted read operation may be for the same address, location, or region, so that the later of the two operations depends on the earlier one. Alternatively, the first unexecuted write operation and the first unexecuted read operation may be for different addresses, locations, or regions, but the later of the two operations may depend on an operation in an intermediate position between the two operations in the command/address buffer 230.

Thus, in various embodiments, the on-die controller 250 initiates the first unexecuted read operation and the first unexecuted write operation from the command/address buffer 230 in parallel, based on whether certain dependencies are satisfied for the read operation and the write operation. However, tracking dependencies on a per-address basis may require multiple address comparisons, a substantial amount of additional hardware for searching through the queued information in the command/address buffer 230, or the like. In certain embodiments, though, the on-die controller 250 may track dependencies on a per-core basis.

In one embodiment, the on-die controller 250 initiates the first unexecuted read operation and the first unexecuted write operation from the command/address buffer 230 in parallel, in response to determining that core dependencies are satisfied for the read operation and the write operation. Conversely, the on-die controller 250 may initiate one of the operations, instead of initiating the operations in parallel, in response to determining that a core dependency is not satisfied for the other operation. In various embodiments, a "core dependency" for an operation may refer to a determination or indication, on a per-core basis, of whether the operation depends on a prior operation for the same core 200. In general, a core dependency is "satisfied" for a write operation if no prior read operation is queued in the command/address buffer 230 for the same core 200 as the write operation. Similarly, in general, a core dependency is "satisfied" for a read operation if no prior write operation is queued in the command/address buffer 230 for the same core 200 as the read operation.

In one embodiment, the on-die controller 250 determines that a core dependency is satisfied for a scheduled operation based on no unexecuted operation of a different type from the scheduled operation being queued in the command/address buffer 230 prior to the scheduled operation, for the same core 200 as the scheduled operation. With reference to a read operation, an operation of a "different type" refers to a write operation. Similarly, with reference to a write operation, an operation of a "different type" refers to a read operation. If different types of operations are unexecuted in the command/address buffer 230 for the same core 200, then a core dependency is unsatisfied for the later operation.

In a certain embodiment, determining whether a core dependency is satisfied for an operation comprises determining whether another valid operation of a different type is scheduled prior to the operation, for the same core 200 as the operation. For example, the on-die controller 250 may determine that a core dependency is satisfied for a read operation and a write operation in response to determining the command/address buffer 230 has no previously-scheduled valid write operations for a core 200 for the read operation, and has no previously-scheduled valid read operations for a core 200 for the write operation.

In various embodiments, tracking dependencies at a per-core level may delay some operations, compared to tracking dependencies at a per-address level. For example, a write operation that depends on a read operation for the same core 200 may not actually depend on the read operation when the operations are considered at the address level, if the write operation and the read operation are for different addresses. However, in some embodiments, tracking dependencies at a per-core level may save time by avoiding multiple address comparisons. Additionally, in certain embodiments, initiating a first unexecuted read operation and a first unexecuted write operation from the command/address buffer 230 in parallel, based on determining that core dependencies are satisfied, may avoid attempting to initiate two operations in parallel for the same core 200. Even if the operations are for different addresses, a single core 200 would process operations sequentially; processing two operations in parallel would involve multiple cores 200.

Figure 3:
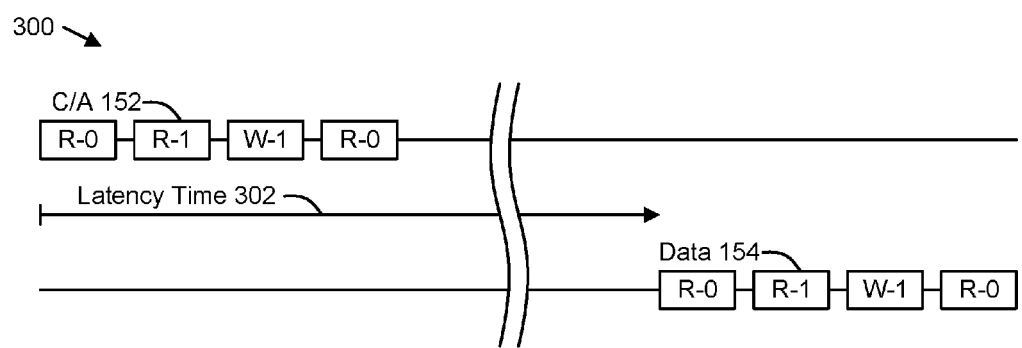
FIG. 3 is a schematic block timeline illustrating one embodiment of a latency time.

FIG. 3 depicts a timeline 300 illustrating one embodiment of a latency time 302. In the depicted embodiment, the timeline 300 illustrates a sequence of command and address information received by a die 202 from a device controller 126 via a command/address path 152. Each operation is labeled with an R or W indicating whether it is a read or a write operation, and with a number indicating which core 200 the operation is addressed to. Thus, the sequence R-0, R-1, W-1, R-0 indicates a read for core 0, a read for core 1, a write for core 1, and a read for core 0. The illustrated sequence of read and write operations is for exemplary and non-limiting purposes; many other sequences of operations for different cores 200 could be similarly processed using a command/address buffer 230 and a command control component 150 for an on-die controller 250.

The timeline 300 further illustrates data transferred via the data path 154. For a read operation, the device controller 126 may retrieve the data from output latches or an output queue of the die 202 (e.g., by sending a clock signal to the die 202 to control the data transfer). For a write operation, the device controller 126 may send the data to the die 202.

The timeline 300 additionally illustrates a latency time 302. In general, in various embodiments, a latency time 302 may refer to any period of time between sending command and address information for a storage operation and transferring data for the storage operation. Latency times 302 may be measured in different ways in various embodiments. For example, in the depicted embodiment, the latency time 302 for the first command (R-0) is measured from the beginning of the command and address information transfer to the beginning of the data transfer for the operation. In another embodiment, a latency time 302 may be measured from the end of the command and address information transfer to the beginning of the data transfer for the operation, or the like. Various measurements of latency time 302 will be clear in view of this disclosure.

In certain embodiments, the device controller 126 is configured to wait a latency time 302 between sending command and address information for a storage operation and transferring data for the storage operation. For example, for a read operation, a latency time 302 may correspond to an amount of time it takes a die 202 to receive and decode the command and address information, dispatch the address to a core 200, process the operation, and have the data ready at an output stage (e.g., a data-out queue managed by the internal bus driver 220). The device controller 126 may wait a read latency time 302 between sending the command and address information and attempting to retrieve the data over the data path 154, so that will be ready when the device controller 126 attempts the transfer.

As a further example, for a write operation, the device controller 126 may wait a write latency time 302 between sending command and address information for the write operation and sending the data to be written. The latency time 302 for a write operation may be different from the time it takes a die 202 to perform the operation, because the die 202 performs the write operation (including sending the address and the data to a core 200) after the data is received. However, a write latency time 302 observed by the device controller 126 between sending the write command and sending the data may correspond to or be based on the read latency time 302, so that data transfers for a series of storage operations occur in the same order in which the device controller 126 sends the command and address information for the storage operations. In various embodiments, read and write latency times 302 may be specified for a die 202 (e.g., by a manufacturer of the die 202), and observed by the device controller 126.

In a further embodiment, the on-die controller 250 maintains an order for data transfers based on an order in which the device controller 126 sends command and address information. For example, in a certain embodiment, the command/address buffer 230 may store operations in the order in which the command and address information for the operations was received from the device controller 126, and the on-die controller 250 may maintain an order for data transfers based on the order of command and address information in the command/address buffer 230.

In various embodiments, transferring the data in the same order as the command and address information may allow the device controller 126 to easily keep track of which data transfers correspond to which commands. However, initiating a read operation and a write operation from a command/address buffer 230 may result in one of the operations executing out of order. For example, if a command/address buffer 230 has queued several write operations for core 0 followed by a read operation for core 1, then the core dependency is satisfied for the read operation (because there is no previously-scheduled, valid write operation for core 1), but initiating the first write operation and the first read operation in parallel would result in data for the read operation being ready before other write operations have completed. The on-die controller 250 may maintain the order for data transfers by queuing or buffering the read data (e.g., in a queue for the internal bus driver 220) until the data transfers for the prior write operations are completed.

In certain embodiments, maintaining an order for data transfers may include delaying, buffering, queuing, or pipelining data for operations that are performed out-of-order (e.g., not in the order in which the commands were sent) so that the data is transferred in the desired order. For example, in one embodiment, the internal bus driver 220 may include separate data-in and data-out FIFOs or queues. In various embodiments, the order for data transfers may be based on the order in which the device controller 126 sends command and address information, or on the order of command and address information in the command/address buffer 230, in various ways. In one embodiment, the order for data transfers may be based on applying latency times 302 to the order for the command and address information. For example, in one embodiment, as described above, a latency time 302 may be similar or identical for read and write operations so that the order of the data transfers is the same as the order of the commands. In another embodiment, however, a latency time 302 may be different for read commands and write commands, and the device controller 126 may attempt to transfer data for a read command and a write command in a different order than the order in which the commands were sent, based on the different latency times 302.

In certain embodiments, the device controller 126 may send command and address information for a second storage operation during a latency time 302 for a first storage operation. For example, in the depicted embodiment, the device controller 126 sends command and address information for a first operation (R-0), and then sends command and address information for three more operations (R-1, W-1, R-0) during the latency time 302 for the first operation. In various embodiments, queuing command and address information in a command/address buffer 230 and executing storage operations in parallel using multiple cores 200 may allow a die 202 to process multiple operations with overlapping latency times 302, instead of processing operations sequentially with non-overlapping latency times 302.

FIGS. 4A-4E depict various embodiments of a command/address buffer 230, at different points in time. In the depicted embodiments, the command/address buffer 230 includes storage space for queuing command and address information, so that each depicted row or entry stores command and address information for one storage operation. In the depicted embodiment, an entry includes command information 402, address information 404, a validity bit 406 and a ready bit 408. Additionally, in the depicted embodiment, the command/address buffer 230 includes an input pointer 420, a read pointer 440, a write pointer 460, and core dependency indicators 480 for the plurality of cores 200. FIGS. 4A-4E depict the process of receiving and initiating the series of commands depicted in FIG. 3 (R-0, R-1, W-1, R-0)

The command information 402 may indicate a type of command or operation. In the depicted embodiment (e.g., in FIG. 4B), the command information 402 indicates whether the operations are read operations or write operations. In another embodiment, command information 402 may more specifically indicate a type of read operation (such as a read pair operation for a pair of addresses, a read commit operation, or the like), or a type of write operation (such as a program operation, an erase operation, or the like). The address information 404 stores addresses for the data operations. As described above, different cores 200 may have locations for storing data for different sets of addresses, so the address information 404 may indicate which core 200 will process a storage operation. For example, in an embodiment with two cores 200 as depicted above with regard to FIG. 2 (e.g. core 0 and core 1) addresses may be assigned to cores 200 based on a most significant bit of the address, a least significant bit of the address, an even or odd parity for the address, or the like. For convenience in depiction, FIGS. 4A-4E depict whether the address information 404 corresponds to core 0 or core 1, instead of depicting actual addresses on the cores 200.

In the depicted embodiment, an entry in the command/address buffer 230 for a storage operation comprises a validity bit 406 that indicates whether the storage operation has been initiated. An operation for which command and address information has been received, but that has not been initiated, may be referred to as "valid" and the validity bit 406 may indicate whether the storage operation is valid (or whether the storage operation has been initiated) in various ways. For example, in the depicted embodiment, a validity bit 406 is set (e.g., to "1") when command and address information for a storage operation is received, and reset (e.g., to "0") when the storage operation is initiated. In another embodiment, the validity bit 406 may be reset when command and address information for a storage operation is received, and set when the storage operation is initiated. Command and address information for invalid operations may be removed from the command/address buffer 230, or may be overwritten as command and address information for further operations is received.

In the depicted embodiment, an entry in the command/address buffer 230 for a storage operation comprises a ready bit 408 that indicates whether the storage operation is ready to be initiated. For example, in the depicted embodiment, a ready bit 408 may be set (e.g., to "1") when a storage operation is ready to be initiated, and may be reset (e.g., to "0") when the storage operation is initiated. Conversely, in another embodiment, a ready bit 408 may be reset when a storage operation is ready to be initiated, and may be set when the storage operation is initiated. In certain embodiments, the ready bit 408 may indicate whether a storage operation is ready to be initiated based on certain resources of the cores 200 or the on-die controller 250. For example, for a read operation, the ready bit 408 may indicate whether a register, buffer, or set of latches for a core 200 is ready to receive a read address. Similarly, in one embodiment, a write operation may be ready to be initiated when the data for the write operation is received from the device controller 126. In a further embodiment, the ready bit 408 may indicate whether data has been received from the device controller 126 and is ready in a data-in buffer or queue of the internal bus driver 220, so that the address and the data are ready to be sent to a core 200 together. Further ways of determining whether a storage operation is ready to be initiated will be clear in view of this disclosure.

In one embodiment, a size of the command/address buffer 230 may be based on a latency time for a storage operation. For example, in certain embodiments, command and address information may be received and queued for multiple storage operations during a latency time for a first storage operation. In a further embodiment, a "size" of the command/address buffer 230 may refer to a number of stages, rows or entries in a command/address buffer 230, an amount of storage space for the command/address buffer 230, or the like. In one embodiment, the size of the command/address buffer 230 may be selected to provide space for storing command and address information for a number of commands that may be received in a latency time. For example, in one embodiment, a latency time for a storage operation may be long enough to send up to 31 additional commands, and a command/address buffer 230 may include at least 32 stages. In a further embodiment, the command/address buffer 230 may include further stages (e.g., 40 stages, including the 32 stages previously discussed) to avoid filling the command/address buffer 230, overwriting command and address information for unexecuted operations, or the like.

In the depicted embodiment, the input pointer 420, the read pointer 440, and the write pointer 460 are used by the on-die controller 250 to point or refer to locations or entries in the command/address buffer 230. In various embodiments a "pointer" may refer to any register, or location for information that "points" or refers to a location in the command/address buffer 230, or to the actual value of the pointer. For example, in one embodiment, a pointer may be an integer that refers to a numbered stage in the command/address buffer 230. In a further embodiment, "incrementing" a pointer may also refer to updating the pointer to point or refer to an immediately subsequent operation in the command/address buffer 230 (e.g., the next stage or entry in the command/address buffer 230). For example, if the stages of the command/address buffer 230 are numbered in order, and the pointer is an integer, the on-die controller 250 may increment a pointer by adding one to the stored integer. In a further embodiment, incrementing a pointer that refers to the last stage of the command/address buffer 230 may comprise updating the pointer to refer to the first stage. Thus, a pointer may be incremented in a circular manner, so that the command/address buffer 230 acts as a circular buffer.

In various embodiments, the on-die controller 250 uses the input pointer 420 to queue the command and address information in the command/address buffer 230, and uses the read pointer 440 and the write pointer 460 to identify read and write operations (respectively) in the command/address buffer 230. The on-die controller 250 may use the command control component 150 to manage and update the input pointer 420, the read pointer 440, and the write pointer 460. The input pointer 420, in certain embodiments, may be similar to an input pointer for a FIFO queue, and the read pointer 440 and write pointer 460 may be similar to an output pointer for a FIFO queue, except that using two output pointers for read and write operations may allow certain operations to be initiated in parallel rather than sequentially. The operation of the pointers is described in further detail below at different time periods for FIGS. 4A-4E.

In a further embodiment, the core dependency indicators 480 are maintained and updated by the on-die controller 250, and indicate whether core dependencies are satisfied for the individual cores 200. The on-die controller 250 may use the command control component 150 to maintain and update the core dependency indicators 480. In general, in various embodiments, a core dependency indicator 480 for a core 200 may include any register, latch, information location, or the like, that stores information indicating whether a core dependency is satisfied or unsatisfied for a read operation on a core 200, or for a write operation on the core 200. In a further embodiment, a core dependency indicator bit may be a single-bit latch, register, or location that acts as a core dependency indicator 480. In one embodiment, a first value for a core dependency indicator bit for a core 200 indicates that a core dependency is unsatisfied for a read operation on the core 200 (and satisfied for a write operation), and a second value for the core dependency indicator bit indicates that a core dependency is unsatisfied for a write operation on the core 200 (and satisfied for a read operation).

For example, in the depicted embodiment, RXW[0] is a core dependency indicator bit for core 0, and RXW[1] is a core dependency indicator bit for core 1. In a further embodiment, additional core dependency indicator bits may be provided for additional cores 200. In one embodiment, the core dependency bit RXW [x] for core x may store a 0, based on the read pointer 440 passing a valid write operation for core x, thus indicating that a core dependency is unsatisfied for a read operation on core x. In further embodiment, the core dependency bit RXW[x] for core x may store a 1, based on the write pointer 460 passing a valid read operation for core x, thus indicating that a core dependency is unsatisfied for a write operation on core x. In a further embodiment, the meaning of the 0 and 1 values for the core dependency bit may be reversed (compared to the meaning in the depicted embodiment). In certain embodiments, using a single bit per core to track core dependencies provides a simple way to determine whether core dependencies are satisfied, without a large amount of additional hardware. The core dependency bits are updated in FIGS. 4A-4E based on the pointers.

Figure 4A:
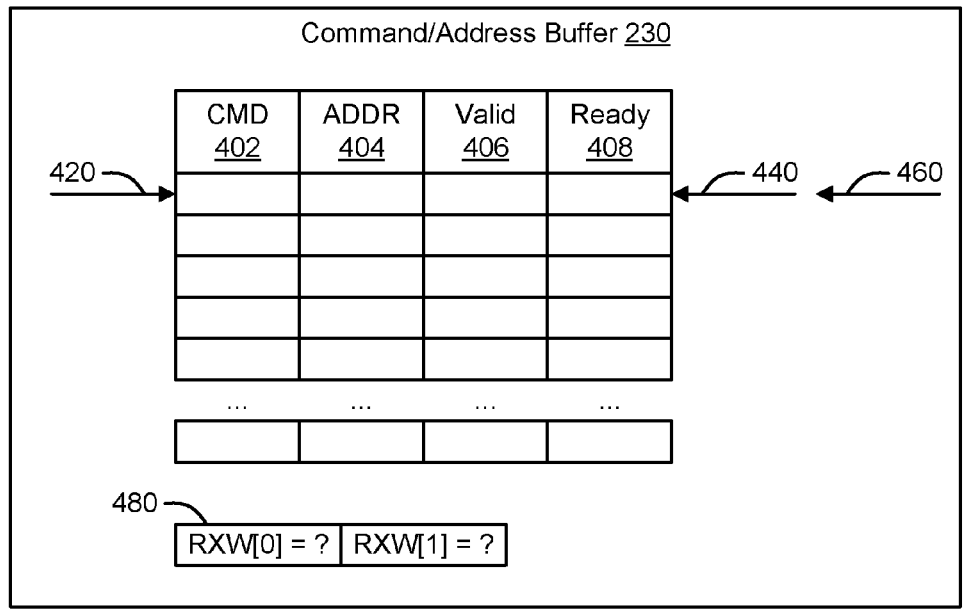
FIG. 4A is a schematic block diagram illustrating one embodiment of a command/address buffer.

In FIG. 4A, the command/address buffer 230 is empty, and the input pointer 420, the read pointer 440, and the write pointer 460 point to the first stage in the command/address buffer 230. The values for the core dependency indicators 480 may be indeterminate at this point: the RXW bits for core 0 and core 1 may not have been set or reset, or may reflect values based on previously performed storage operations that are no longer queued in the command/address buffer 230.

In the depicted embodiment, the command/address buffer 230 queues or store command and address information by storing the command and address information in a location in the command/address buffer 230 pointed to by the input pointer 420. The on-die controller 250 then increments the input pointer 420 to point to the next empty or invalid location in the command/address buffer 230. Thus, in FIG. 4B, four commands have been received. The first read command for core 0 is stored in the first stage of the command/address buffer 230, the read command for core 1 is stored in the second stage of the command/address buffer 230, the write command for core 1 is stored in the third stage of the command/address buffer 230, the second read command for core 0 is stored in the fourth stage of the command/address buffer 230, and the input pointer 420 points to the fifth stage of the command/address buffer 230, which remains empty.

In the depicted embodiment, the on-die controller 250 uses the read pointer 440 and the write pointer 460 to identify the first unexecuted read operation and the first unexecuted write operation in the command/address buffer 230. In a certain embodiment, the read pointer 440 is incremented by the on-die controller 250 based on initiating a read operation pointed to by the read pointer 440, and/or based on determining that the read pointer 440 points to an unexecuted write operation. Similarly, in a further embodiment, the write pointer 460 is incremented by the on-die controller 250 based on initiating a write operation pointed to by the write pointer 460, and/or based on determining that the write pointer 460 points to an unexecuted write operation.

Figure 4B:
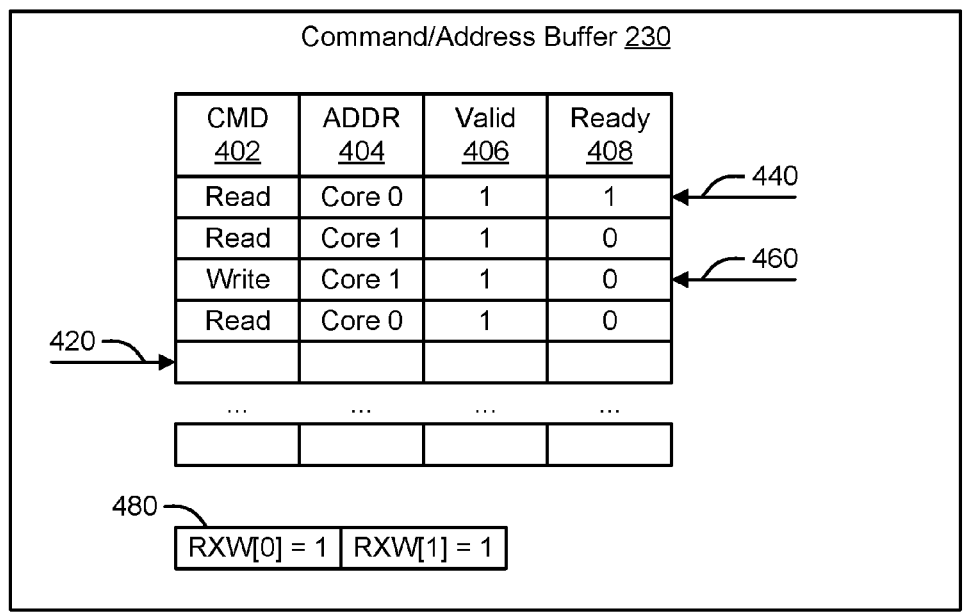
FIG. 4B is a schematic block diagram illustrating a further embodiment of a command/address buffer.

In FIG. 4B, the pointers have been updated but no storage operations have been initiated. Thus, the read pointer 440 points to the first read operation for core 0, in the first stage of the command/address buffer 230. The read pointer 440 has not been incremented from its initial position in FIG. 4A, because the read operation at that stage has not yet been initiated. The ready bit 408 for the read operation has been set to a 1, indicating that the operation is ready to be initiated. The write pointer 460 has been incremented twice, based on previously pointing to the unexecuted read operations in the first and second stages of the command/address buffer 230, and now points to the write operation for core 1, in the third stage of the command/address buffer 230. The write point has not been incremented further, because the write operation at the third stage of the command/address buffer 230 has not yet been initiated. The ready bit 408 for the write operation is a 0, indicating that the write operation is not ready to be performed. For example, the data for the write operation may not have been received from the device controller 126 yet.

Because the on-die controller 250 increments the pointers one stage at a time, to point to immediately subsequent operations in the command/address buffer 230, the write pointer 460 may temporarily point to a read operation on its way to locating an unexecuted write operation, and the read pointer 440 may temporarily point to a write operation on its way to locating an unexecuted read operation. However, in certain embodiments, updating or incrementing pointers one stage at a time may provide a simple way to locate the first unexecuted read operation and the first unexecuted write operation, without complex pointer look-ahead hardware. In further embodiments, an internal clock for incrementing the pointers may be faster than an external clock for transferring data. For example, a pointer may be incremented several times, based on fast internal clock cycles, in one clock cycle of a slower external clock for transferring data. In certain embodiments, updating pointers based on a fast internal clock allows the first unexecuted read operation and the first unexecuted write operation to be quickly located.

Additionally, in some embodiments, updating pointers one stage at a time may facilitate updating core dependency indicators 480. In a certain embodiment, the on-die controller 250 may update a core dependency indicator 480 based on the read pointer 440 pointing to an unexecuted write operation for the core 200, and/or based on the write pointer 460 pointing to an unexecuted read operation for the core 200. Thus, in FIG. 4B, RXW[0] for core 0 has been updated to 1 based on the write pointer 460 having passed the first read operation for core 0, in the first stage of the command/address buffer 230, and RXW[1] for core 1 has been updated to 1 based on the write pointer 460 having passed the read operation for core 1, in the second stage of the command/address buffer 230. Because RXW[1]=1, the core dependency for the first unexecuted write operation is unsatisfied: the read operation for core 1 should be initiated before the write operation for core 1. Thus, even if the ready bit 408 indicated that the write operation was ready, the on-die controller 250 would not dispatch the write operation pointed to by the write pointer 460 and the read operation pointed to by the read pointer 440 in parallel.

Figure 4C:
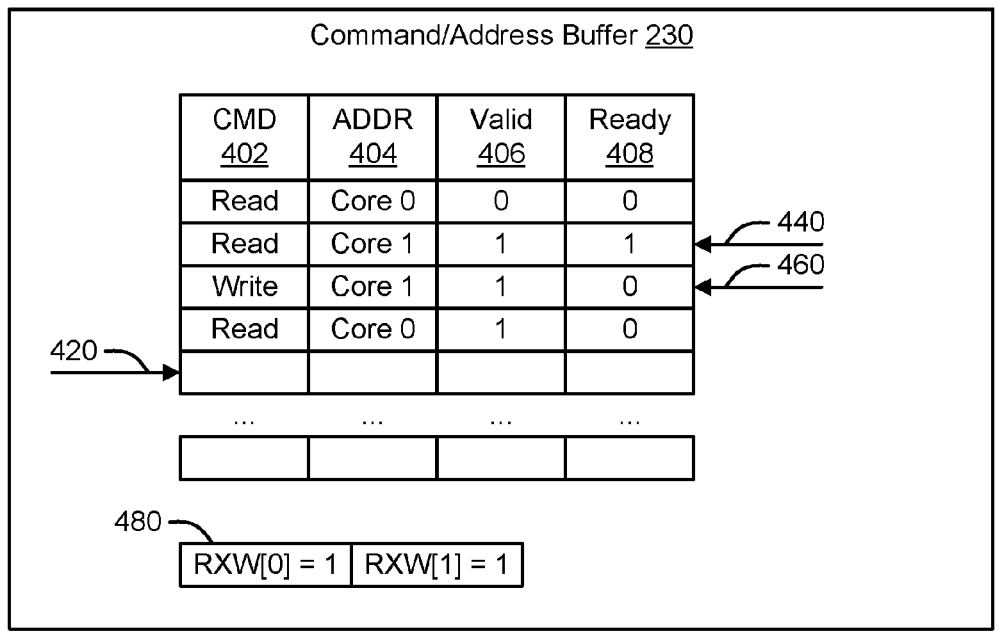
FIG. 4C is a schematic block diagram illustrating a further embodiment of a command/address buffer.

In FIG. 4C, the first read operation for core 0, at the first stage of the command/address buffer 230 has been initiated, so the on-die controller 250 has reset the validity bit 408 to 0 and incremented the read pointer 440. The first stage of the command/address buffer 230 may therefore be treated as an empty stage, because the operation has been initiated and is no longer valid. The next command is also a read command, and has not yet been executed, so the read pointer 440 is not incremented further. The write pointer 460 has not been further incremented, because the write operation has not yet been executed. The core dependency indicators 480 store the same information as in FIG. 4B, because the read pointer 440 has not passed a valid write command. Therefore, the core dependency for the write command is still unsatisfied: the read command for core 1 will be initiated before the write command.

Figure 4D:
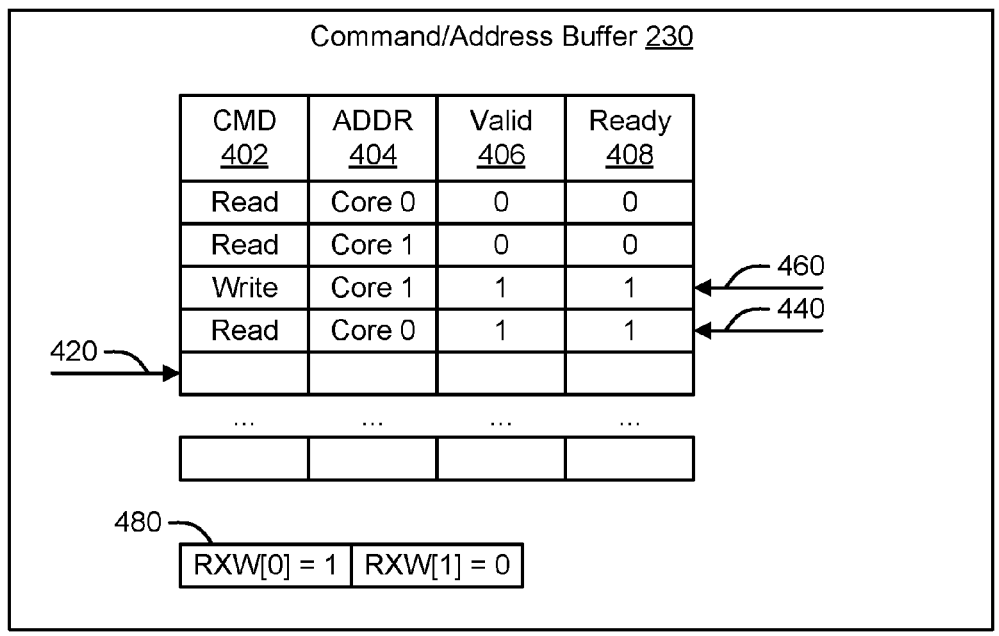
FIG. 4D is a schematic block diagram illustrating a further embodiment of a command/address buffer.

In FIG. 4D, the read command for core 1, at the second stage of the command/address buffer 230 has been initiated, so the read pointer 440 has been incremented and the validity bit 406 for the second stage has been reset to 0. Because the next operation in the command/address buffer 230 is a write operation for core 1, the on-die controller 250 increments the read pointer 440 one stage further, so that the read pointer 440 points to the unexecuted read operation for core 0, in the fourth stage of the command/address buffer 230. Additionally, because the read pointer 440 passed a write operation for core 1, the on-die controller 250 updates the core dependency indicators 480 so that RXW [1]=0, indicating that a core dependency would be unsatisfied for a read operation on core 1, because the write operation for core 1 should be initiated first.

In FIG. 4D, the core dependencies are satisfied for both the write operation pointed to by the write pointer 460 and the read operation pointed to by the read pointer 440. The write operation is for core 1 and RXW [1]=0, indicating that the read pointer 440 has passed the write operation for core 1. Also, the read operation is for core 0, and RXW [0]=1, indicating that the core dependency is satisfied for the read operation (but would be unsatisfied for a write operation on core 0). The on-die controller 250 has set the ready bits 408 for both operations to 1, indicating that the operations are ready to be performed. For example, the ready bit 408 for the write operation may indicate that the data to be written has been received from the device controller 126, and the ready bit 408 for the read operation may indicate that a page buffer for core 0 is ready to receive an address for a read operation. Therefore, the on-die controller 250 initiates the read operation and the write operation in parallel.

Figure 4E:
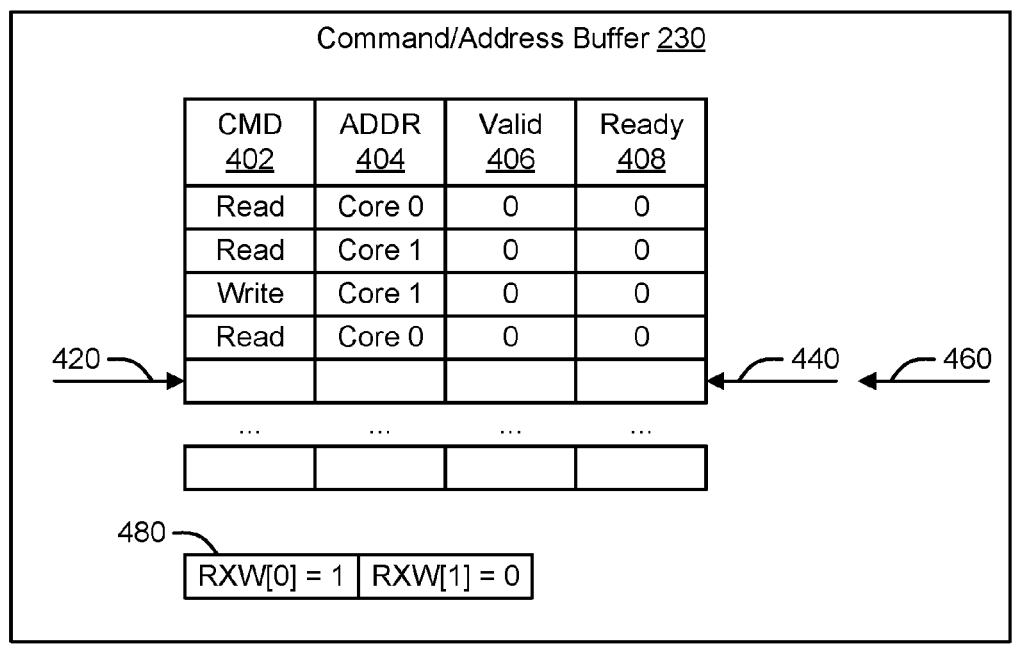
FIG. 4E is a schematic block diagram illustrating a further embodiment of a command/address buffer.
Figure 5:
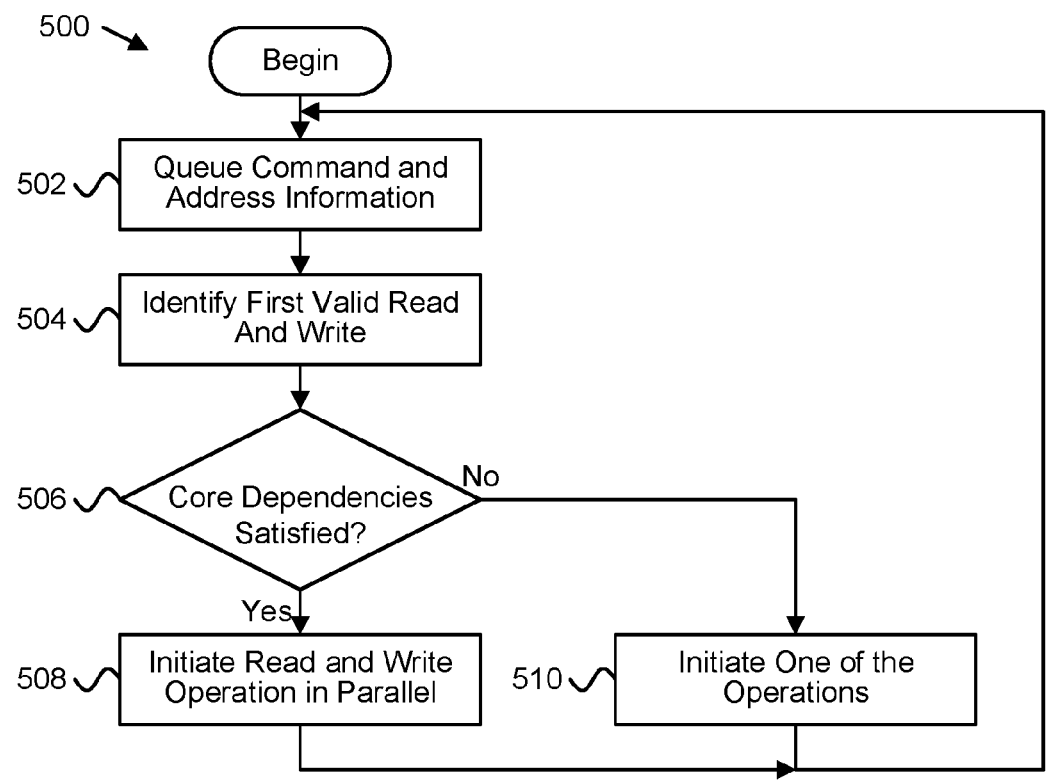
FIG. 5 is a schematic flow chart diagram illustrating one embodiment of a method for controlling commands for non-volatile memory.

In FIG. 4E, the write command at the third stage of the command/address buffer 230 and the read command at the fourth stage of the command/address buffer 230 have been initiated in parallel. The corresponding validity bits 406 have been reset to 0, and the read pointer 440 and the write pointer 460 have been incremented. The read pointer 440 and the write pointer 460 are not incremented beyond the fifth stage of the command/address buffer 230, because the fifth stage does not yet store an operation. In certain embodiments, invalid operations may be treated as empty stages of the command/address buffer 230, and the pointers may be incremented in a circular manner as described above, so the configuration of the command/address buffer 230 in FIG. 4E is substantially equivalent to the initial configuration in FIG. 4A FIG. 5 is a schematic flow chart diagram illustrating one embodiment of a method 500 for controlling commands for non-volatile memory. The method 500 begins, and the command/address buffer 230 queues 502 command and address information for a plurality of storage operations for non-volatile memory cores 200 that share a data path 154 for a non-volatile memory die 202. The on-die controller 250 identifies 504 a first valid read operation and a first valid write operation, based on the queued command and address information. The on-die controller 250 determines 506 whether core dependencies are satisfied for the read operation and the write operation. If the core dependencies are satisfied for both operations, the on-die controller 250 initiates 508 the read operation and the write operation in parallel, and the method 500 continues as the command/address buffer 230 continues to queue 502 command and address information. If the core dependencies are not satisfied for both operations, the on-die controller 250 initiates 510 one of the operations, for which a core dependency is satisfied, and the method 500 continues as the command/address buffer 230 continues to queue 502 command and address information.

A means for queuing command and address information, in various embodiments, may include a command/address path 152, a command/address decoder 240, a command/address buffer 230, an on-die controller 250, a command control component 150, an input pointer 420, a modified FIFO, a ring buffer, a range of memory locations, other logic hardware, and/or other executable code stored on a computer readable storage medium. Other embodiments may include similar or equivalent means for queuing command and address information.

A means for identifying a first valid read operation and a first valid write operation based on the queued command and address information, in various embodiments may include a command/address buffer 230, an on-die controller 250, a command control component 150, a read pointer 440, a write pointer 460, other logic hardware, and/or other executable code stored on a computer readable storage medium. Other embodiments may include similar or equivalent means for identifying a first valid read operation and a first valid write operation.

A means for determining whether core dependencies are satisfied for the first valid read operation and the first valid write operation, in various embodiments, may include a command/address buffer 230, an on-die controller 250, a command control component 150, a read pointer 440, a write pointer 460, one or more core dependency indicators 480, other logic hardware, and/or other executable code stored on a computer readable storage medium. Other embodiments may include similar or equivalent means for determining whether core dependencies are satisfied.

A means for initiating the first valid read operation and the first valid write operation in parallel, in various embodiments, may include a command/address buffer 230, an on-die controller 250, a command control component 150, a read pointer 440, a write pointer 460, an internal bus driver 220, a shared data path 154, one or more separate internal data paths 210, one or more cores 200, other logic hardware, and/or other executable code stored on a computer readable storage medium. Other embodiments may include similar or equivalent means for initiating a read operation and a write operation in parallel.

A means for updating a core dependency indicator for a core 200, in various embodiments, may include a command/address buffer 230, an on-die controller 250, a command control component 150, a read pointer 440, a write pointer 460, one or more core dependency indicators 480, other logic hardware, and/or other executable code stored on a computer readable storage medium. Other embodiments may include similar or equivalent means for determining whether core dependencies are satisfied.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   one or more memory die, a memory die comprising:
   a plurality of non-volatile memory cores that share a data path, the cores comprising arrays of non-volatile memory cells;
   a command/address buffer that queues command and address information for a plurality of storage operations for the non-volatile memory cores; and
   an on-die controller that initiates a first unexecuted read operation and a first unexecuted write operation from the command/address buffer in parallel, in response to determining that core dependencies are satisfied for the read operation and the write operation, and that updates a core dependency indicator for a core to indicate that a core dependency is not satisfied in response to one or more of a read pointer for the command/address buffer pointing to an unexecuted write operation for the core and a write pointer for the command/address buffer pointing to an unexecuted read operation for the core.

2. The apparatus of claim 1, wherein the core dependency is satisfied for a scheduled operation based on no unexecuted operation of a different type from the scheduled operation being queued in the command/address buffer prior to the scheduled operation, for the same core as the scheduled operation.

3. The apparatus of claim 1, wherein the on-die controller uses the read pointer and the write pointer to identify the first unexecuted read operation and the first unexecuted write operation in the command/address buffer.

4. The apparatus of claim 3, wherein the on-die controller increments the read pointer in response to one or more of: initiating a read operation pointed to by the read pointer, and determining that the read pointer points to the unexecuted write operation.

5. The apparatus of claim 3, wherein the on-die controller increments the write pointer in response to one or more of: initiating a write operation pointed to by the write pointer, and determining that the write pointer points to an unexecuted read operation.

6. The apparatus of claim 3, wherein the on-die controller increments a pointer by updating the pointer to point to an immediately subsequent operation in the command/address buffer, wherein an internal clock for incrementing the pointers is faster than an external clock for transferring data.

7. The apparatus of claim 1, wherein the on-die controller maintains a core dependency indicator bit for each core, such that a first value for a core dependency indicator bit for the core indicates that the core dependency is unsatisfied for the read operation on the core, and a second value for the core dependency indicator bit indicates that the core dependency is unsatisfied for the write operation on the core.

8. The apparatus of claim 1, wherein queueing command and address information for a storage operation comprises storing the command and address information in a location in the command/address buffer pointed to by an input pointer.

9. The apparatus of claim 1, wherein the on-die controller maintains an order for data transfers based on an order of command and address information in the command/address buffer.

10. The apparatus of claim 1, wherein a size of the command/address buffer is based on a latency time for a storage operation.

11. The apparatus of claim 1, wherein an entry in the command/address buffer for a storage operation comprises a validity bit that indicates whether the storage operation has been initiated.

12. The apparatus of claim 1, wherein an entry in the command/address buffer for a storage operation comprises a ready bit that indicates whether the storage operation is ready to be initiated.

13. The apparatus of claim 12, wherein a write operation is ready to be initiated when the data for the write operation is received.

14. A system comprising
one or more memory die, a memory die comprising:
a plurality of non-volatile memory cores, the cores comprising arrays of non-volatile memory cells;
a command/address queue that stores command and address information for a plurality of storage operations for the non-volatile memory cores;
an on-die controller that dispatches addresses for executing a first valid read operation and a first valid write operation from the command/address queue in parallel, in response to determining that core dependencies are satisfied for the first valid read operation and the first valid write operation, and that updates a core dependency indicator for a core to indicate that a core dependency is not satisfied in response to one or more of a read pointer for the command/address queue pointing to an unexecuted write operation for the core and a write pointer for the command/address queue pointing to an unexecuted read operation for the core; and
a device controller that communicates with the on-die controller for a selected die to send command and address information and to transfer data for storage operations on the selected die.

15. The system of claim 14, wherein the cores for a memory die share a single data path for communicating with the device controller.

16. The system of claim 14, wherein the device controller waits a latency time between sending command and address information for a storage operation and transferring data for the storage operation, and the on-die controller maintains an order for data transfers based on an order in which the device controller sends command and address information.

17. The system of claim 14, wherein the device controller sends command and address information for a second storage operation during a latency time for a first storage operation.

18. An apparatus comprising: means for queuing command and address information for a plurality of storage operations for non-volatile memory cores that share a data path for a non-volatile memory die; means for identifying a first valid read operation and a first valid write operation, based on the queued command and address information, the means for identifying the first valid read operation and the first valid write operation comprising a read pointer and a write pointer; means for initiating the first valid read operation and the first valid write operation in parallel based on determining that core dependencies are satisfied for the first valid read operation and the first valid write operation; and means for updating a core dependency indicator for a core to indicate that a core dependency is not satisfied in response to one or more of the read pointer pointing to an unexecuted write operation for the core and the write pointer pointing to an unexecuted read operation for the core.

* * * * *